United States Patent
Hori et al.

(10) Patent No.: US 7,995,674 B2
(45) Date of Patent: Aug. 9, 2011

(54) DIGITAL PREDISTORTION TRANSMITTER

(75) Inventors: Kazuyuki Hori, Tokyo (JP); Shouhei Murakami, Yokohama (JP); Yuji Ishida, Fujisawa (JP); Tomoya Uchiike, Fujisawa (JP); Yoshiaki Hasegawa, Kawasaki (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/929,083

(22) Filed: Dec. 29, 2010

(65) Prior Publication Data
US 2011/0096865 A1  Apr. 28, 2011

Related U.S. Application Data

(63) Continuation of application No. 11/703,768, filed on Feb. 8, 2007, now Pat. No. 7,864,881.

(30) Foreign Application Priority Data

Apr. 11, 2006  (JP) .................................. 2006-108211

(51) Int. Cl.
*H04L 25/49* (2006.01)
*H03C 1/06* (2006.01)
(52) U.S. Cl. .......................... 375/296; 332/160; 332/162
(58) Field of Classification Search .......... 375/295–297, 375/285; 455/114.2, 114.3; 332/117, 123–125, 332/149, 159, 160, 162
See application file for complete search history.

(56) References Cited

U.S. PATENT DOCUMENTS

| | | | |
|---|---|---|---|
| 6,236,837 B1 | 5/2001 | Midya | |
| 6,240,278 B1 | 5/2001 | Midya et al. | |
| 6,288,610 B1 | 9/2001 | Miyashita | |
| 6,956,433 B2 | 10/2005 | Kim et al. | |
| 7,098,734 B2 | 8/2006 | Hongo et al. | |
| 7,161,990 B2 | 1/2007 | Hori et al. | |
| 7,333,559 B2 | 2/2008 | Song et al. | |
| 7,551,686 B1 | 6/2009 | Coons et al. | |

(Continued)

FOREIGN PATENT DOCUMENTS

JP  10-145146  5/1998

(Continued)

OTHER PUBLICATIONS

Kai Fu et al. "A New Power Amplifier Predistortion Architecture Based on Memory Polynomial Model," IEEE, 2009, pp. 1-5.*

(Continued)

*Primary Examiner* — Tesfaldet Bocure
(74) *Attorney, Agent, or Firm* — Stites & Harbison PLLC; Juan Carlos A. Marquez, Esq.

(57) ABSTRACT

There is a need for effectively compensating distortion when a predistortion transmitter is subject to not only a memory effect due to nonlinearity of an amplifier, but also a modulator's DC offset, IQ unbalance, or local quadrature error. A predistortor to be used is a polynomial predistortor including a polynomial basis generation portion and an inner product calculation portion. The polynomial basis generation portion delays a real part and an imaginary part of a complex input signal $Sx=Ix+jQx$ for up to M samples to generate $2(M+1)$ signals, duplicately combines these signals to generate monomials having maximum degree N, and outputs, as a basis vector, all or part of the monomials depending or needs. The inner product calculation portion performs an inner product calculation using a coefficient vector, i.e., a set of complex numbers sized equally to the basis vector to find a polynomial value and outputs the value as a complex signal.

3 Claims, 4 Drawing Sheets

U.S. PATENT DOCUMENTS

| | | |
|---|---|---|
| 2003/0108120 A1 | 6/2003 | Hori et al. |
| 2006/0133536 A1 | 6/2006 | Rexberg |
| 2008/0008263 A1 | 1/2008 | Keerthi et al. |

FOREIGN PATENT DOCUMENTS

| | | |
|---|---|---|
| JP | 2000-022659 | 1/2000 |
| JP | 2001-268150 | 9/2001 |
| JP | 2003-174332 | 6/2003 |
| JP | 2005-101908 | 4/2005 |

OTHER PUBLICATIONS

Masatoshi Nakayama et al., "Techniques for Low Distortion and High Efficiency Power Amplifiers", URL: HTTP://WWW.APMC-MEW.ORGMEW2005/SRC/TL/TL03-02.PDF, (Nov. 9, 2005), 17 pages.

Allen Katz et al., "Minimizing Power Amplifier Memory Effects", Linearizer Technology, Inc., (Oct. 7, 2004), pp. 1-30.

Joel Vuolevi, "Analysis, Measurement and Cancellation of the Bandwidth and Amplitude Dependence of Intermodulation Distortion in RF Power Amplifiers", Department of Electrical Engineering, University of Oulu, http://herkules.oulu.fi/isbn9514265149/html/index.html, 8 pages.

Hiroko Kawaguchi et al., "Nonlinearity Compensation with Adaptive Predistorter for an Amplifier Affected by Even-Order Distortion", Journal of Thesis of Electronics Information and Communications Society, vol. J87-C, No. 1 (2004), pp. 49-53 in Japanese, pp. 1-12 in English.

Saneharu Muneyasu et al., "Non-Linear Digital Signal Processing", System Control Information Library 19, (Mar. 20, 1999) pp. 1-24, in Japanese with English translation.

Zhu et al., "Open-Loop Digital Predistorter for RF Power Amplifier Using Dynamic Deviation Reduction Based on Volterra Series," IEEE transaction on Communications, 2008, pp. 1524-1534.

\* cited by examiner

US 7,995,674 B2

DIGITAL PREDISTORTION TRANSMITTER

CLAIM OF PRIORITY

This application is a Continuation of U.S. patent application Ser. No. 11/703,768 filed Feb. 8, 2007 now U.S. Pat. No. 7,864,881. The present application claims priority from U.S. patent application Ser. No. 11/703,768 filed Feb. 8, 2007, which claims priority from Japanese Application No. JP 2006-108211 filed on Apr. 11, 2006, the content of which is hereby incorporated by reference into this application.

FIELD OF THE INVENTION

The present invention relates to a digital predistortion technology for compensating a nonlinear distortion generated in a power amplifier of a radio transmitter used for mobile communication base stations by means of a nonlinear signal process provided for a digital signal processing device disposed previously to the power amplifier.

BACKGROUND OF THE INVENTION

There is a demand for improving the efficiency of a power amplifier in a radio transmitter used for mobile communication base stations in order to miniaturize the apparatus size and reduce the power consumption. Operating the power amplifier with large output generates a distortion due to the nonlinearity of an amplifying device and leaks the power outside a transmission frequency band. Radio wave regulations and wireless standards regulate such leak so as not to interfere with the other radio communications. To reduce nonlinear distortion during a large-output operation, various distortion compensation techniques have been developed as described in non-patent document 1.

One example is the digital predistortion using a digital signal processing device such as an FPGA. FIG. 1 shows its standard construction. A lookup table and a polynomial are used to implement a predistortor 101. The predistortor 101 nonlinearly processes baseband complex input signal $Sx=Ix+jQx$ in a digital region and outputs baseband complex signal $Sy=Iy+jQy$. A quadrature modulation DA converter (Quadrature DAC) 102 converts the signal into an analog RF signal. A power amplifier (PA) 103 amplifies the signal for output. A quadrature demodulation AD converter (Quadrature ADC) 104 converts the output signal into a digital baseband complex signal $Sz=Iz+jQz$ and performs a subtraction with respect to input signal Sx to extract residual distortion signal $Se=Sz-Sx$. An adaptation algorithm 105 rewrites table values or corrects polynomial coefficients so as to minimize the power for Se. In this manner, nonlinear input/output characteristics of the predistortor 101 are adjusted autonomously.

The performance of the digital predistortion depends on the accuracy of a model provided by the predistortor 101 with reference to nonlinearity of the power amplifier 103. Conventionally, the so-called AM/AM or AM/PM conversion is considered to be a dominant model. The AM/AM or AM/PM conversion model settles an amplitude distortion and a phase distortion depending on an instantaneous value for input amplitude. The model is a function using an amplitude (real number) as input and a complex number as output. Many conventional predistortors are provided with the AM/AM or AM/PM conversion model as represented in patent documents 1 through 3.

Incompleteness of the quadrature modulation DA converter 102 preceding the power amplifier may cause a DC offset, IQ unbalance, or local quadrature error. Such situation reveals a limited capability of the above-mentioned predistortor based on the function model using a real number input and a complex number output. There is a need for introducing a function using a complex number input and a complex number as described in patent document 4 in consideration for an input signal phase.

[Patent document 1] JP-A No. 268150/2001, "Linearizer."
[Patent document 2] JP-A No. 22659/2000, "OFDM modulator."
[Patent document 3] JP-A No. 145146/1998, "Nonlinear distortion compensator."
[Patent document 4] JP-A No. 174332/2003, "Predistortion-type amplifier."
[Patent document 5] JP-A No. 101908/2005, "Amplifier having predistortion-based distortion compensation function."
[Non-patent document 1] Nakayama and Takagi. "Power amplifier technique for reduced distortion and improved efficiency."
[Non-patent document 2] Allen Katz, Marc Franco, "Minimizing Power Amplifier Memory Effects," Linearizer Technology, Inc., Oct. 7, 2009, pp. 1-30.
[Non-patent document 3] Joel Vuolevi, "Analysis, measurement and cancellation of the bandwidth and amplitude dependence of intermodulation distortion in RF power amplifiers," Journal of Thesis of Electronics Information and Communications Society, Vol. J-7-C, No. 1 (2004), pp. 49-53.
[Non-patent document 4] Kawaguchi and Akabori. "Distortion compensation using an adaptive predistorter for an amplifier subject to even-ordered distortion," the Institute of Electronics, Information and Communication Engineers: Article magazine vol. J87-C No. 1, pp. 49-53, April, 2004.
[Non-patent document 4] Muneyasu and Taguchi. "Nonlinear digital signal processing," Asakura Publishing Co., Ltd., 1999.

SUMMARY OF THE INVENTION

The similarity between the conventional predistortors is the use of a model that settles an output value correspondingly to an instantaneous value for an input signal. No output depends on a past input signal value. Such model is generically called a memoryless model. The memoryless model works relatively excellently when a medium-output amplifier for several watts of output amplifies a narrowband signal of approximately 1 MHz. However, the memoryless model greatly degrades the performance when a large-output amplifier for several tens of watts of output amplifies a wideband signal of approximately 10 MHz. A possible cause is considered to expose a memory effect phenomenon that an output from the power amplifier depends not only on an input instantaneous value, but on a past state. Non-patent document 2 or 3 gives the comprehensible description about the memory effect.

According to these documents, the memory effect is considered to result from a combined factor of the following (1) through (4).

(1) Frequency characteristic of an amplifying device
(2) Thermal feedback
(3) Remodulation due to a bias circuit impedance of a gate or a drain
(4) Device-related effect Non-patent document 4 and patent document 5 describe the conventional technologies for preventing performance degradation due to the memory effect by focusing attention on the factor (3) remodulation due to a bias circuit impedance.

Judging from the circuit constructions, these technologies are some types of a so-called envelope filtering technique described in non-patent documents 2 and 3.

The envelope filtering technique raises an input signal amplitude to the even-numbered power and filters a resulting signal. The technique multiplies the signal by the input signal to generate a time-dependent signal component. The technique parallel or serially adds the signal component to a memoryless predistortor output signal. Non-patent document 4 provides an analog predistortion example and uses the inductor-based high-pass filter for a square value of an input signal amplitude. On the other hand, patent document 5 uses the differential high-pass filter.

Two problems are assumed for these conventional technologies. Firstly, the technologies mainly rely on the remodulation effect according to a bias circuit impedance. The model is complicated when the other memory effect factors ((1), (2), and (4) above) become apparent. There is a limit on the simple model according to the conventional technologies. As a result, the compensation performance is expected to degrade.

Secondly, the digital predistortion contains an inherent problem. The digital predistortion needs to insert a quadrature modulation DA converter between the predistortor and the power amplifier. This incompleteness may add a DC offset, IQ unbalance, or quadrature error, i.e., an error component independent of the input signal amplitude. Phase information about an input signal also needs to be considered as described in patent document 4. The digital predistortion based only on the amplitude information cannot sufficiently compensate distortion.

In consideration for the above-mentioned conditions, an appropriate solution is using a general-purpose expansion model rather than simplifying the model by specializing in specific degradation factors as described in non-patent document 4 and patent document 5. That solution collectively assumes the quadrature modulation DA converter, the power amplifier, and the quadrature demodulation AD converter to be one black box. The black box has the nonlinear characteristic and the time dependence and behaves as a complex nonlinear filter that uses complex numbers for both input and output. Accordingly, the predistortor also needs to have such property.

In consideration of the above-mentioned problems of the conventional technology, the invention provides a polynomial predistortor comprising a polynomial basis generation portion for generating a basis vector Xv based on a complex input signal Sx=Ix+jQx and an inner product calculation portion for outputting an inner product Cv·Xv as a polynomial value multiplied by a coefficient vector Cv.

The polynomial predistortor delays a real part and an imaginary part of a complex input signal Sx=Ix+jQx for up to M samples to generate 2(M+1) signals, duplicately combines these signals to generate monomials having maximum degree N, outputs, as the basis vector Xv, all or part of the monomials depending or needs, and uses, as the coefficient vector Cv, a set of complex numbers sized equally to the basis vector Xv.

The polynomial predistortor expands Volterra series suitable for modeling a nonlinear time-invariant system so that an input signal becomes a complex number Sx=Ix+jQx and an output signal'becomes a complex number Sy=Iy+jQy.

The above-mentioned construction can implement a model that expands a Volterra series to a complex function. The Volterra series is one of series expansions for nonlinear time-invariant system functions as described in non-patent document 5. Generally, the Volterra series is an expansion into power series concerning two axes, i.e., amplitude and time axes. The invention uses the Volterra series as an expansion into power series concerning three axes, i.e., in-phase axis I for an amplitude, quadrature axis Q, and the time axis.

In this manner, the predistortor can have the most general-purpose complex nonlinear filter characteristic. Only increasing degree N and tap count M as needed can compensate for nonlinear distortions containing all types of memory effects.

The predistortor is not implemented as a function for amplitudes (real numbers) according to the conventional technology, but can be implemented as a time-dependent function using complex number input and complex number output. Accordingly, the predistortor can effectively compensate for distortions even containing a DC offset, IQ unbalance, and local quadrature error.

DETAILED DESCRIPTION OF THE PREFERRED EMBODIMENTS

Figure 1:
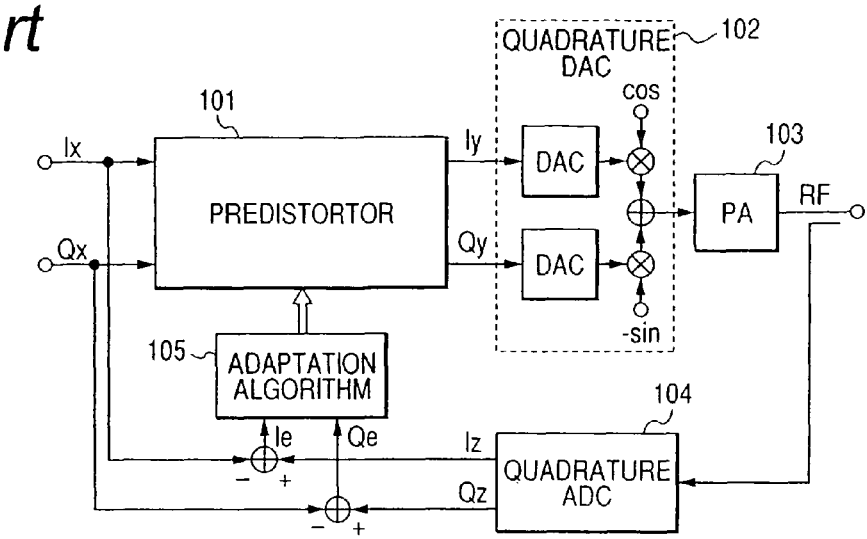
FIG. 1 shows a construction of an ordinary digital predistortion transmitter.
Figure 2:
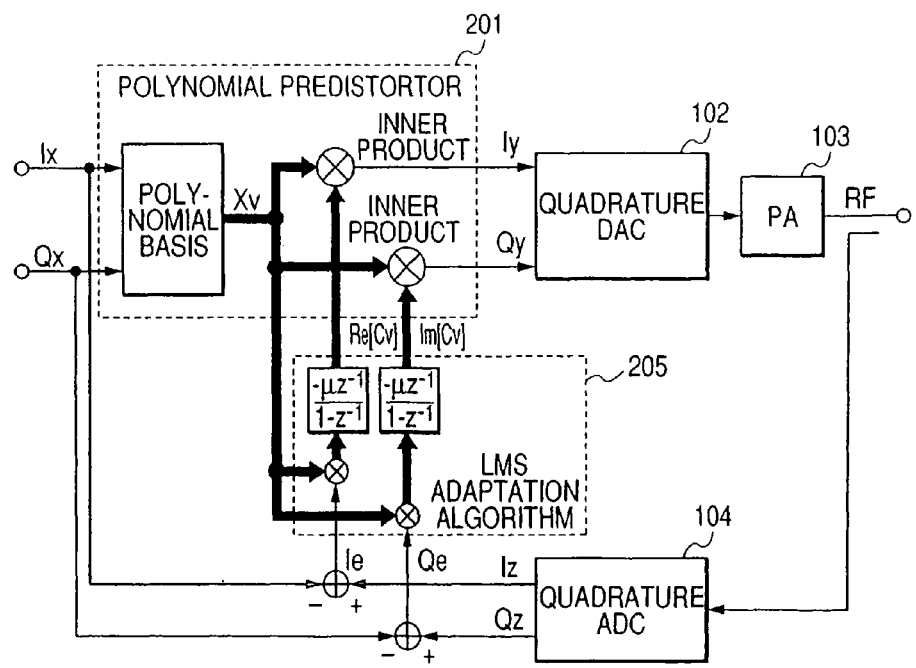
FIG. 2 shows a digital predistortion transmitter according to the invention.

An embodiment of the present invention will be described with reference to FIGS. 2 and 4. FIG. 2 is a construction diagram of a transmitter according to the invention. The predistortor 101 in FIG. 1 is replaced by a polynomial predistortor 201 including a polynomial basis generation portion and an inner product calculation portion. In FIG. 2, a complex signal is explicitly divided into real part I and imaginary part Q. A vector signal is represented with a thick line. The adaptation algorithm 105 is replaced by a representative LMS algorithm 205.

Figure 4:
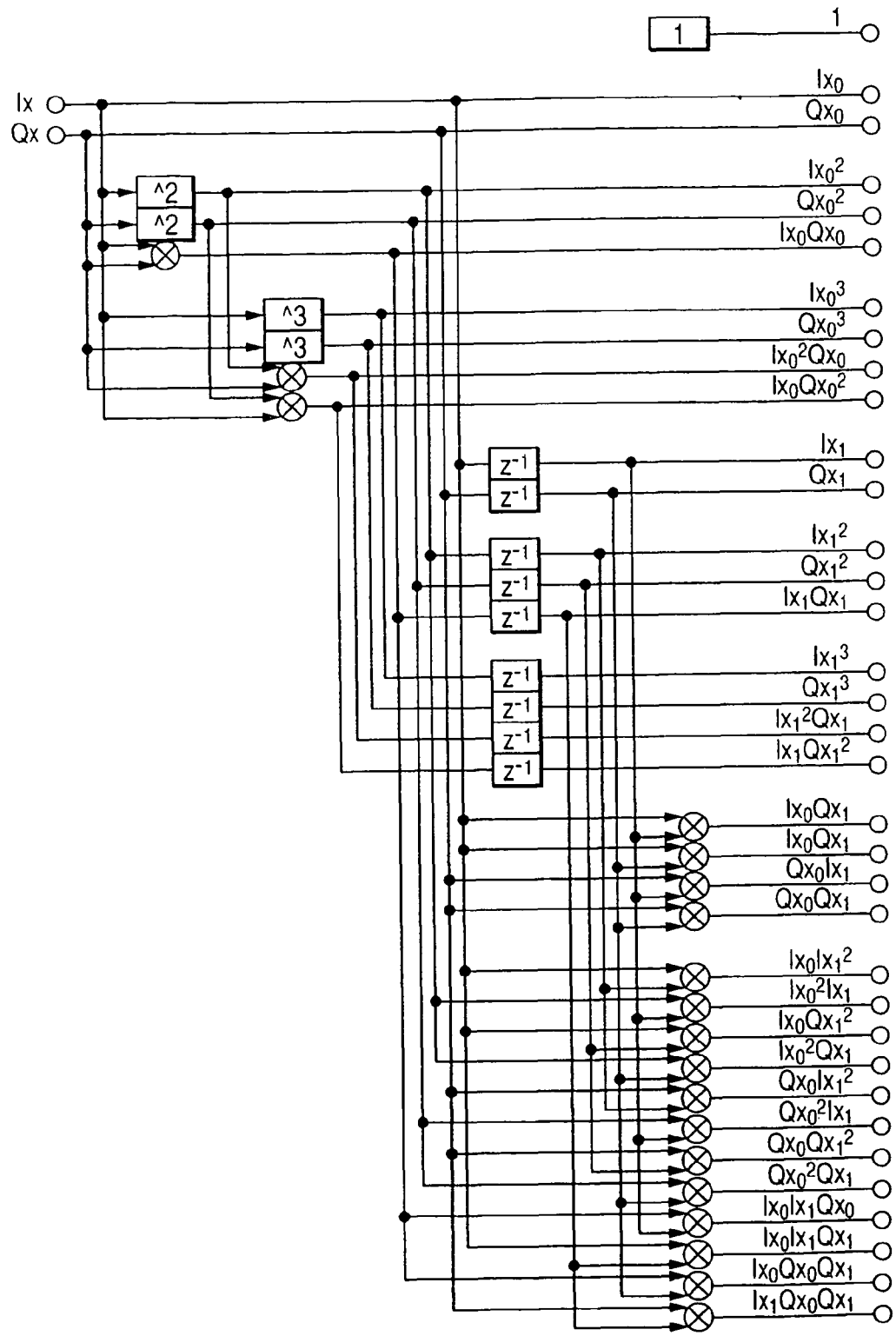
FIG. 4 shows a construction of a degree-3 1-tap polynomial basis generating portion.

FIG. 4 is an embodiment of the polynomial basis generation portion in FIG. 2 and shows a 3rd order 1-tap polynomial example. In FIG. 4, subscript 1 is used to represent input digital baseband signals Ix and Qx delayed by one like $Ix_1$ and $Qx_1$. Delay zero is equivalent to Ix and Qx but is represented by subscript 0 in distinction from delay one. The polynomial basis allows duplicate use of four signals $Ix_0$, $Qx_0$, $Ix_1$, and $Qx_1$ and generates all possible combinations of monomials of 0th to 3rd order.

0th order monomial is a constant term 1. 1st order monomials are $Ix_0$, $Qx_0$, $Ix_1$, and $Qx_1$ unchanged. 2nd order monomials can be made by selecting two of the four signals regardless of duplication and multiplies the two together to generate the following ten terms equivalent to $_4H_2=10$ (H is a symbol representing the duplicate combination): $Ix_0^2$, $Ix_1^2$, $Qx_0^2$, $Qx_1^2$, $Ix_0Qx_0$, $Ix_1Qx_1$, $Ix_0Ix_1$, $Qx_0Qx_1$, $Ix_0Qx_1$, and $Qx_0Ix_1$. 3rd order monomials can be made by selecting three of the four signals regardless of duplication and multiplies the three together to generate the following twenty terms equivalent to $_4H_3=20$: $Ix_0^3$, $Qx_0^3$, $Ix_0^2Qx_0$, $Ix_0Qx_0^2$, $Ix_1^3$, $Qx_1^3$, $Ix_1Qx_1^2$, $IX_0Ix_1^2$, $IX_0^2Ix_1$, $Ix_0Qx_1^2$, $Ix_0^2Qx_1$, $Qx_0Ix_1^2$, $Qx_0^2Ix_1$, $Qx_0Qx_1^2$, $Qx_0^2Qx_1$, $Ix_0Ix_1Qx_0$, $Ix_0Ix_1Qx_1$, $Ix_0Qx_0Qx_1$, and $Ix_1Qx_0Qx_1$. It is assumed to generate vector signal Xv containing these 35 terms as elements.

Coefficient vector Cv contains 35 complex numbers. The predistorter performs inner product operation Cv·Xv with vector Xv to output complex number Sy=Iy+jQy. The quadrature modulation DA converter 102 converts signal Sy into an analog RF signal. The power amplifier 103 amplifies the analog RF signal for output. On the other hand, the quadrature demodulation AD converter 104 returns part of the output analog RF signal power to digital baseband signal $Sz=Iz+jQz$.

The quadrature demodulation AD converter 104 may be available in various constructions. In any case, the digital IF architecture causes the least degradation in the signal quality and can be most appropriately used for the digital predistortion. Specifically, an analog RF signal is once frequency-converted into an IF band. An analog IF signal is AD-converted to generate a digital IF signal that is then quadrature-demodulated in the digital region. Digital baseband signal $Sz=Iz+jQz$ generated in this manner is subject to a subtraction with respect to digital baseband signal $Sx=Ix+jQx$ to extract residual distortion $Se=Ie+jQe$.

The LMS adaptation algorithm 205 sequentially updates coefficient vector Cv so as to minimize the power for residual distortion Se. Specifically, the LMS adaptation algorithm 205 finds an instantaneous gradient by multiplying vector signal Xv and residual distortion Se together. The LMS adaptation algorithm 205 adds the instantaneous gradient as a correction amount to the most recent coefficient vector to generate a new coefficient vector. This correction signifies integration. FIG. 2 represents the correction using a transfer function for an integrator. Constant-μ is a parameter for controlling a response speed and steadiness. The constant is called a step size parameter or a step gain and takes a small value. Value μ may be always the same for each element or may vary depending on needs. The negative sign is prefixed to control the coefficient vector so as to minimize the power for residual distortion Se along the gradient. The LMS adaptation algorithm based on the above-mentioned construction starts from an appropriate initial value (e.g., zero) for coefficient vector Cv and approaches a true value after lapse of a given time period. After reaching a steady state, the algorithm minutely oscillates around the true value due to randomness of the signal.

The use of the above-mentioned construction can implement the predistortor based on the complex Volterra series model, making it possible to provide the most general-purpose complex nonlinear filter characteristic. Only increasing degree N and tap count M as needed can compensate for nonlinear distortions containing all types of memory effects. The predistortor is not implemented as an amplitude-dependent function according to the conventional technology, but can be implemented as a time-dependent function using complex number input and complex number output. Accordingly, the predistortor can effectively compensate for distortions even containing a DC offset, IQ unbalance, and local quadrature error.

Figure 3:
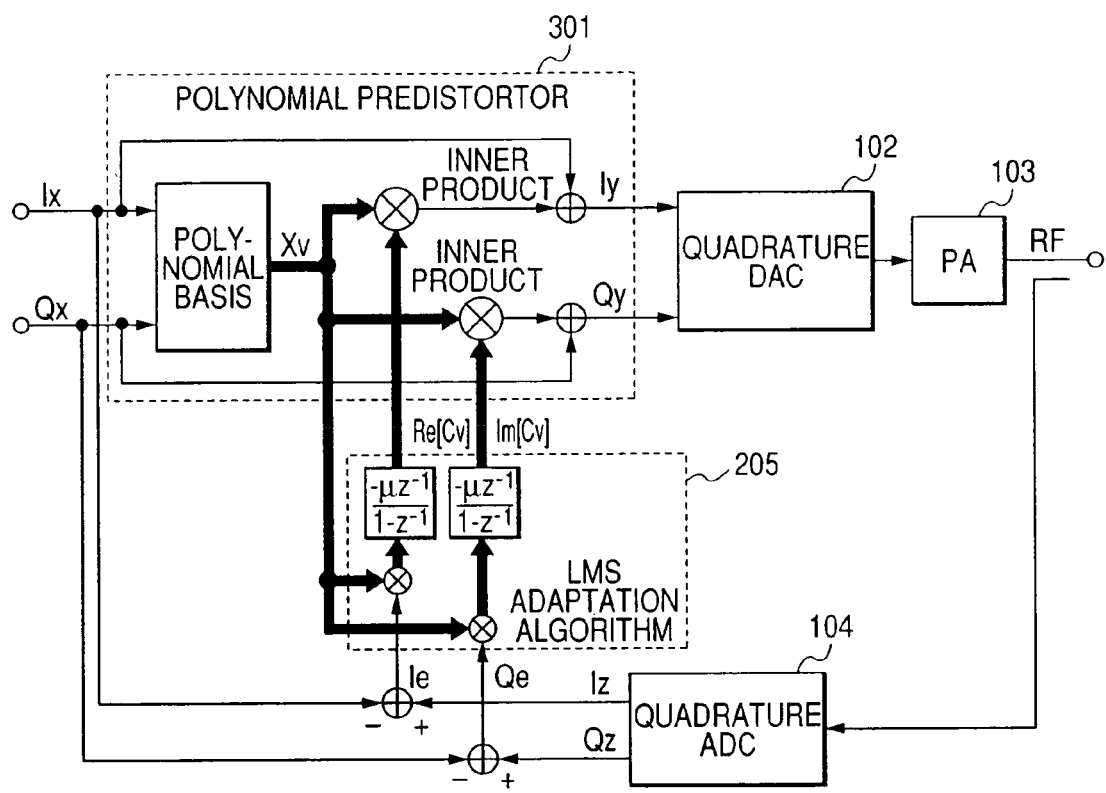
FIG. 3 shows the digital predistortion transmitter in FIG. 2 supplemented by a feedthrough term.
Figure 5:
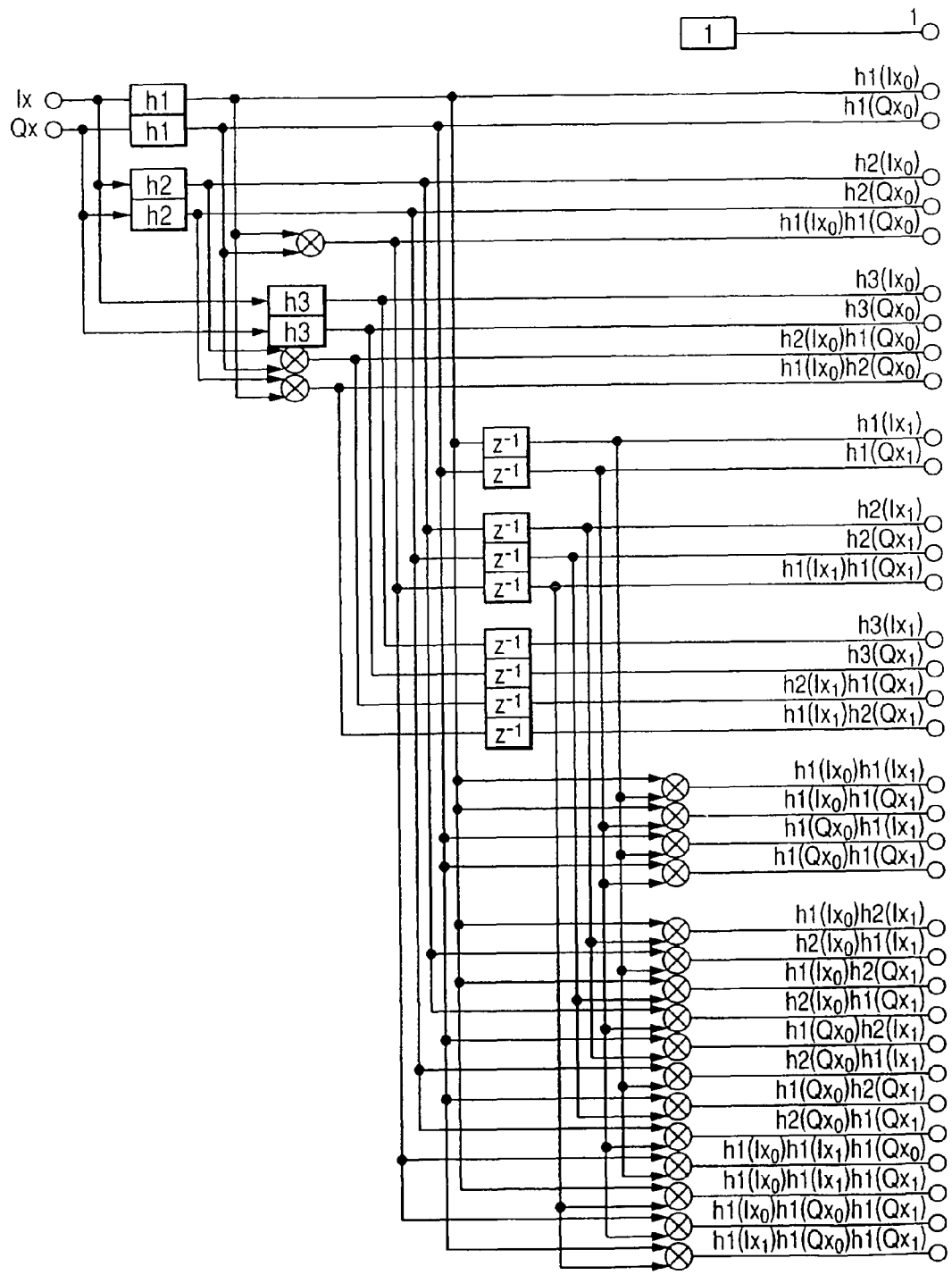
FIG. 5 shows another construction of a degree-3 1-tap polynomial basis generating portion.

Various modifications may be made in the invention. While the embodiment uses basis vector Xv containing 35 monomials, for example, it may be preferable to select a new basis vector obtained by previously applying an appropriate linear conversion to basis vector Xv. Depending on conversion methods, it may be possible to improve a convergence speed of the adaptation algorithm. While the basis vector size is unchanged and the degree count does not increase because of the linear conversion, each element of the basis vector is a polynomial, not a monomial. Numerous conversion methods are available. As shown in FIG. 5, for example, a basis vector can be selected by representing a degree-n Hermite polynomial as $h_n$ and Xv as: 1, $h_1(Ix_0)$, $h_1(Qx_0)$, $h_1(Ix_1)$, $h_1(Qx_1)$, $h_2(Ix_0)$ $h_2(Qx_0)$, $h_2(Ix_1)$, $h_2(Qx_1)$, $h_1(Ix_0)h_1(Qx_0)$, $h_1(Ix_1)h_1(Qx_1)$, $h_1(Ix_0)h_1(Ix_1)$, $h_1(Qx_0)h_1(Qx_1)$, $h_1(Ix_0)h_1(Qx_1)$, $h_1(Qx_0)h_1(Ix_1)$, $h_3(Ix_0)$, $h_3(Qx_0)$, $h_2(Ix_0)$ $h_1(Qx_0)$, $h_1(Ix_0)$ $h_2(Qx_0)$, $h_3(Ix_1)$, $h_3(Qx_1)$, $h_2(Ix_1)h_1(Qx_1)$, $h_1(Ix_1)h_2(Qx_1)$, $h_1(Ix_0)$, $h_2(Ix_1)$, $h_2(Ix_0)$ $h_1(Ix_1)$, $h_1(Ix_0)$ $h_2(Qx_1)$, $h_2(Ix_0)$ $h_1(Qx_1)$, $h_1(Qx_0)$, $h_2(Ix_1)$, $h_2(Qx_0)$ $h_1(Ix_1)$, $h_1(Qx_0)h_2(Qx_1)$, $h_2(Qx_0)$ $h_1(Qx_1)$, $h_1(Ix_0)$ $h_1(Ix_1)h_1(Qx_0)$ $h_1(Ix_0)h_1(Ix_1)h_1(Qx_1)$, $h_1(Ix_0)h_1(Qx_0)h_1(Qx_1)$, and $h_1(Ix_1)h_1(Qx_0)h_1(Qx_1)$. As shown in FIG. 3, there may be another modification of adding input signal Sx as a feedthrough term to inner product operation $Cv \cdot Xv$ and outputting $Sy=Sx+Cv \cdot Xv$.

There may be a case where an input signal causes a high peak factor that follows the normal distribution. In such case, the invention is more effective when used with the peak factor reduction process as described in patent document 6.

[Patent document 6] Japanese Patent 3702829, "Peak factor reduction apparatus."

When a baseband signal approximates to the normal distribution, an OFDM or CDMA signal may cause a peak power that does not occur frequently but becomes 10 dB or more higher than an average power. On the other hand, the predistortion is effective for improving a nonlinear distortion occurring in an amplifier's linear region, but is ineffective for a distortion occurring due to saturation of the amplifier. Therefore, an output needs to be decreased to prevent the amplifier from being saturated, thus hindering the efficiency from being improved.

When the peak factor reduction process is inserted before the predistortion, the peak power can be limited to smaller than or equal to a specified value that is determined so as to balance the signal quality. It is possible to prevent a nonlinear distortion resulting from the amplifier saturation and increase an amplifier output to improve the efficiency.

Obviously, the invention can delete unnecessary terms depending on characteristics of a power amplifier to be used. The inventors made the principle experimentally based on the constructions in FIGS. 3 and 5. Let us suppose that the peak power is limited to approximately 8 dB by using a 2 GHz band power amplifier made of a silicon MOS device together with a peak factor reduction apparatus. We confirmed that a nonlinear distortion can be effectively decreased by deleting degree-2 terms from FIG. 5 and using a predistortor provided with part of additional degree-5 terms. The following twelve degree-5 terms are added: $h5(Ix_0)$, $h4(Ix_0)h1(Qx_0)$, $h3(Ix_0)h2(Qx_0)$, $h2(Ix_0)h3(Qx_0)$, $h1(Ix_0)h4(Qx_0)$, $h5(Qx_0)$, $h5(Ix_1)$, $h4(Ix_1)h1(Qx_1)$, $h3(Ix_1)h2(Qx_1)$, $h2(Ix_1)h3(Qx_1)$, $h1(Ix_1)h4(Qx_1)$, and $h5(Qx_1)$.

What is claimed is:

1. A transmitter comprising:

a DA converter which converts complex signal into analog signal;

a power amplifier which amplifies the analog signal to be outputted and outputs an output signal with the amplified analog signal;

an AD converter which coverts the output signal into an outputted complex signal;

a coefficient vector generator which generates a coefficient vector on the basis of the outputted complex signal and a first input complex signal inputted from an external of the transmitter;

a digital predistortor includes a signal vector generator which generates a signal vector on the basis of the first complex input signal and a second complex input signal which has been inputted before the first input complex signal;

a complex signal generator which generates the complex signal to be converted by the DA converter on the basis of the coefficient vector and the signal vector.

2. A transmitter according to claim 1, further comprises a memory which holds the second complex input signal wherein the signal vector generator obtains the second complex input signal from the memory for generating a signal vector.

3. A transmitter according to claim 1, wherein the coefficient vector generator which generates a residual signal on the basis of difference between the first complex input signal and the outputted complex signal.

* * * * *